United States Patent
Mueller et al.

(10) Patent No.: US 9,269,785 B2
(45) Date of Patent: Feb. 23, 2016

(54) SEMICONDUCTOR DEVICE WITH FERROELECTRIC HAFNIUM OXIDE AND METHOD FOR FORMING SEMICONDUCTOR DEVICE

(71) Applicant: GLOBALFOUNDRIES Inc., Grand Cayman (KY)

(72) Inventors: Johannes Mueller, Dresden (DE); Dina H. Triyoso, Dresden (DE); Robert Binder, Dresden (DE); Joachim Metzger, Butzbach (DE); Patrick Polakowski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/165,209

(22) Filed: Jan. 27, 2014

(65) Prior Publication Data

US 2015/0214322 A1  Jul. 30, 2015

(51) Int. Cl.
*H01L 21/00* (2006.01)
*H01L 29/00* (2006.01)
*H01L 29/51* (2006.01)
*H01L 21/02* (2006.01)
*H01L 21/3105* (2006.01)
*H01L 27/115* (2006.01)

(52) U.S. Cl.
CPC .......... *H01L 29/516* (2013.01); *H01L 21/0228* (2013.01); *H01L 21/02181* (2013.01); *H01L 21/02186* (2013.01); *H01L 21/02266* (2013.01); *H01L 21/3105* (2013.01); *H01L 27/11507* (2013.01); *H01L 29/511* (2013.01); *H01L 29/517* (2013.01); *H01L 29/518* (2013.01)

(58) Field of Classification Search
CPC ............... H01L 21/02181; H01L 21/3105; H01L 21/02266; H01L 21/0228; H01L 21/02186; H01L 29/516; H01L 29/511; H01L 29/517; H01L 29/518; H01L 27/11507
USPC ........... 257/295, 412, 532; 438/591, 197, 216
See application file for complete search history.

(56) References Cited

U.S. PATENT DOCUMENTS

| | | | | |
|---|---|---|---|---|
| 7,183,604 B2 * | 2/2007 | Cartier et al. | .................. | 257/310 |
| 7,834,419 B2 * | 11/2010 | Ohtsuka et al. | ................ | 257/532 |
| 7,875,912 B2 * | 1/2011 | Ahn et al. | ...................... | 257/288 |
| 8,304,823 B2 | 11/2012 | Boescke | | |
| 8,664,103 B2 * | 3/2014 | Hempel et al. | ................ | 438/595 |
| 9,064,802 B2 * | 6/2015 | Watanabe | ............. | H01L 29/517 |

(Continued)

OTHER PUBLICATIONS

Boescke et al., "Phase transitions in ferroelectric silicon doped hafnium oxide," Appl. Phys. Lett., 99:112904, 2011.

(Continued)

*Primary Examiner* — Nikolay Yushin
(74) *Attorney, Agent, or Firm* — Amerson Law Firm, PLLC

(57) ABSTRACT

The present disclosure provides a semiconductor device comprising a substrate, an undoped $HfO_2$ layer formed over the substrate and a TiN layer formed on the $HfO_2$ layer. Herein, the undoped $HfO_2$ layer is at least partially ferroelectric. In illustrative methods for forming a semiconductor device, an undoped amorphous $HfO_2$ layer is formed over a semiconductor substrate and a TiN layer is formed on the undoped amorphous $HfO_2$ layer. A thermal annealing process is performed for at least partially inducing a ferroelectric phase in the undoped amorphous $HfO_2$ layer.

18 Claims, 3 Drawing Sheets

(56) References Cited

U.S. PATENT DOCUMENTS

| | | | |
|---|---|---|---|
| 2004/0028952 A1* | 2/2004 | Cartier et al. | 428/698 |
| 2004/0175882 A1 | 9/2004 | Ahn et al. | |
| 2006/0267113 A1* | 11/2006 | Tobin | H01L 21/28194 257/408 |
| 2007/0131997 A1* | 6/2007 | Ohtsuka et al. | 257/301 |
| 2008/0224240 A1* | 9/2008 | Ahn et al. | 257/411 |
| 2008/0303119 A1* | 12/2008 | Watanabe | H01L 29/517 257/632 |
| 2009/0261395 A1* | 10/2009 | Boescke | 257/295 |
| 2012/0315749 A1* | 12/2012 | Hempel et al. | 438/591 |

OTHER PUBLICATIONS

Mueller et al., "Ferroelectricity in yttrium-doped hafnium oxide," J. Appl. Phys., 110:114113, 2011.

Mueller et al., "Ferroelectricity in Simple Binary ZrO2 and HfO2," Nanoletters, 12:4318-23, 2012.

Mueller et al., "Incipient Ferroelectricity in Al-Doped HfO2 Thin Films," Adv. Funct. Mater., 22:2412-17, 2012.

Translation of Official Action from Taiwan Patent Application No. 103139342 dated Sep. 18, 2015.

* cited by examiner

SEMICONDUCTOR DEVICE WITH FERROELECTRIC HAFNIUM OXIDE AND METHOD FOR FORMING SEMICONDUCTOR DEVICE

BACKGROUND OF THE INVENTION

1. Field of the Invention

The present invention generally relates to semiconductor devices, and, more particularly, to complex semiconductor devices with ferroelectric hafnium oxide, and a method for forming an according semiconductor device.

2. Description of the Related Art

Integrated circuits typically comprise a very large number of circuit elements formed on a given area of a chip, wherein a semiconductor device represents an important implementation of a circuit element. For example, current advanced ICs (integrated circuits) are formed by millions of field effect transistors, which are also referred to as MOS transistors or MOSFETS, and in general MOSFETs may be considered as dominant semiconductor devices in modern ICs. Efforts towards increased performance and low integration volume have, therefore, been mainly directed to reducing the size of basic transistor structures. A drive to continuously improve the performance of semiconductor devices is given by Moore's law of scaling, which demands that the number of semiconductor devices in an IC increases exponentially, e.g., doubling over a two or three year period. As a consequence, minimum feature sizes of transistors have decreased exponentially with about each year.

Despite a plurality of scaling reducing process technologies having been developed and practiced so as to comply with Moore's law, it is clear that scaling cannot go on forever, particularly as constraints imposed by materials become increasingly important at advanced scaling nodes. For example, the thickness of a gate dielectric layer in a gate electrode of an advanced transistor structure has become so thin (under 2 nm) that a gate leakage current caused by direct tunneling of electrons from the gate electrode into a channel region (generally located underneath the gate electrode) increases with decreasing layer thickness and, as a result, the power dissipation of any integrated circuit based on such transistors becomes unacceptable.

In using high-k dielectric materials, the gate leakage problem can be addressed by providing gate dielectrics with high-k dielectric materials, such as hafnium oxide-based materials, which allows increasing the capacitive coupling of the gate electrode to the channel without reducing the thickness of the gate dielectric. Therefore, the implementation of gate dielectrics by means of high-k dielectric materials allows not only increasing the performance of individual transistor elements, but also reducing the dimensions of semiconductor devices and consequently incorporating increased functionality into a given chip area.

Further efforts to increase the functionality built into a given chip area resulted in approaches to eliminate secondary storage systems. These approaches are based on the development of non-volatile memory devices which do not lose stored information when power supply is lost. Herein, efforts are directed to the development of ferroelectric RAMs or FeRAM devices which make use of dielectric layers with ferroelectric properties. Current FeRAMs appear to show, in comparison with conventional flash memory devices, lower power usage at higher writing performances and a greater number of write-erase cycles. Consequently, intensive investigations have been conducted to ferroelectric materials in order to provide non-volatile memory devices.

Therefore, ferroelectric materials have been considered for forming highly efficient capacitors. The effect that one makes use of herein is the possibility to adjust the polarization state of a ferroelectric material on the basis of appropriate electrical fields which are applied to the ferroelectric material. Since the polarization state of a ferroelectric material is preserved unless it is exposed to a high, with regard to the polarization state counter-oriented electrical field, or a high temperature, it is possible to "program" a capacitor formed of ferroelectric material such that an induced polarization state reflects an information unit. The reason is that an induced polarization state may be preserved, even upon removing a "programmed" capacitor from a power supply. Opposed to conventional storage capacitors of known flash memory designs, a refreshment of the state of the capacitor is not required. Another advantage of ferroelectric materials is the comparatively high dielectric constant of ferroelectric materials (k greater than 4) which may enable fabricating semiconductor devices with superior performance as compared to conventional semiconductor devices.

Although a ferroelectric field effect transistor or a ferroelectric capacitor represent in theory very promising concepts for complex semiconductor devices, it is a difficult task to identify appropriate ferroelectric materials which are compatible with existing manufacturing processes, particularly at advanced technology nodes. For example, commonly known ferroelectric materials, such as PZT or perovskites, are not compatible with standard CMOS processes. However, recent research results indicate that hafnium oxide-based dielectric materials may represent promising candidates for materials with ferroelectric behavior. To date, it is known that hafnium (Hf) rich materials exhibit a predominantly monoclinic structure with paraelectric behavior and pure $HfO_2$ is known to be of paraelectric nature. With regard to hafnium-based materials, however, recent results indicated that the monoclinic structure is suppressed in Zr, Si, Y and Al-doped hafnium oxide materials and stabilized crystal structures of ferroelectric nature were obtained in accordingly-doped samples. Examples of ferroelectric hafnium-based materials are, for example, discussed in Mueller et al., "Incipient Ferroelectricity in Al-doped $HfO_2$ Thin Films," *Adv. Funct. Mater.*, 22:2412-17 (2012), Mueller et al., "Ferroelectricity in yttrium-doped hafnium oxide," *J. Appl. Phys.*, 110:114113 (2011), Mueller et al., "Ferroelectricity in Simple Binary $ZrO_2$ and $HfO_2$," *Nanoletters*, 12:4318-23 (2012), and Boeske et al., "Phase Transitions in Ferroelectric Silicon-doped Hafnium Oxide," *Appl. Phys. Lett.*, 99:112904 (2011).

Presently, the ferroelectric nature of some hafnium-based materials as opposed to the paraelectric nature of hafnium rich materials is considered as originating from an appropriate crystalline state being established in accordingly-doped hafnium oxide material which provides the ferroelectric nature was not observed that pure hafnium oxide does not have due to its monocline crystal structure.

Although ferroelectric material on the basis of hafnium oxide may be expected to show a better compatibility with existing CMOS processes, several drawbacks for ferroelectric non-volatile memory devices are observed in actual implementations. Particularly, the doping of a deposited ferroelectric hafnium oxide layer, for instance in the framework of an ALD process, raises a lot of issues with regard to how to include the doping of the ferroelectric hafnium oxide layer into the ALD sequence. For instance, a necessarily complex recipe structure for including dopants into ferroelectric hafnium oxide reduces the throughput of existing process flows. Particularly in ALD processes, additional doping precursors are necessary that usually suffer from low-ALD capability. It is observed that doping in ALD processes is not possible to a sufficient degree. For hafnium oxide, there is a narrow process window for establishing a ferroelectric phase by including dopants into the hafnium oxide, leading to difficult process control, for example with XPS-analysis, and bad doping uniformity. As large fluctuations of device parameters occur across wafers, it is not possible, for example, to provide sufficient memory window uniformity for ferroelectric FET devices.

In view of the above-described state in the art, it is desirable to provide a semiconductor device with incorporated ferroelectric behavior in good compatibility with standard manufacturing techniques and without deteriorated performance of fabricated semiconductor devices and lowering throughput. It is further desirable to provide a method for forming a semiconductor device with ferroelectric properties in agreement with standard CMOS processes and particularly which can be included into standard processes without inferring complex recipe structures.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides a semiconductor device and a method for forming a semiconductor device, wherein a semiconductor substrate having an undoped ferroelectric hafnium oxide material layer is provided.

In one aspect of the present disclosure, a semiconductor device is provided. In some illustrative embodiments herein, the semiconductor device includes a substrate, an undoped $HfO_2$ layer formed over the substrate and a TiN layer formed on the $HfO_2$ layer, wherein the undoped $HfO_2$ layer is at least partially ferroelectric.

In another aspect of the present disclosure, a method for forming a semiconductor device is provided. In some illustrative embodiments herein, the method includes forming an undoped amorphous $HfO_2$ layer over a substrate, forming a TiN layer on the undoped amorphous $HfO_2$ layer and performing a thermal annealing process for at least partially inducing a ferroelectric phase in the undoped amorphous $HfO_2$ layer.

BRIEF DESCRIPTION OF THE DRAWINGS

The disclosure may be understood by reference to the following description taken in conjunction with the accompanying drawings, in which like reference numerals identify like elements, and in which.

Figure 1A:
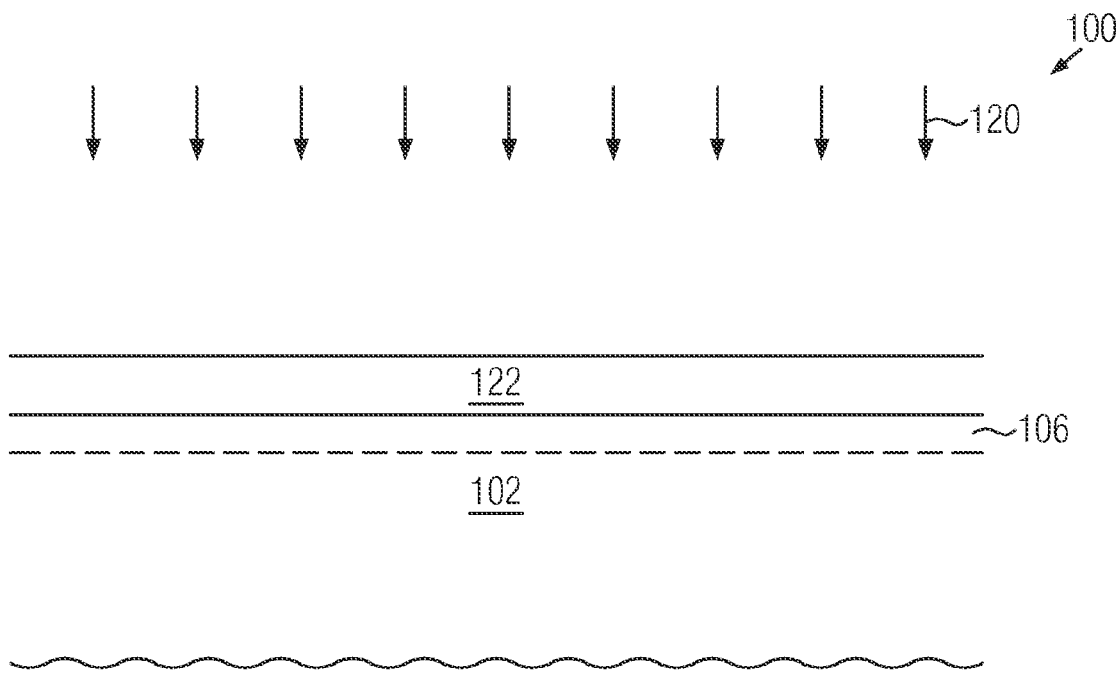
FIGS. 1a-1c schematically illustrate methods for forming a semiconductor device in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present invention relates to semiconductor devices integrated on a chip and to semiconductor device structures integrated on a chip. Semiconductor devices may, for example, be given by metal oxide semiconductor devices (MOS devices), capacitors, e.g., MIM/MIS capacitors, resistor structures or the like. When referring to MOS devices, the person skilled in the art will appreciate that although the expression "MOS device" is used, no limitation to a metal-containing gate material and/or to an oxide-containing gate dielectric material is intended. When referring to MIM/MIS capacitors, the person skilled in the art will appreciate that although the expression "MIM/MIS" is used, no limitation to a metal-containing electrode is intended. Semiconductor devices of the present disclosure, and particularly MOS devices and/or capacitors as illustrated by means of some illustrative embodiments as described herein, concern elements fabricated by using advanced technologies. Semiconductor devices of the present disclosure are fabricated by technologies applied to approach technology nodes smaller than 100 nm, preferably smaller than 50 nm, more preferably smaller than 35 nm. The person skilled in the art will appreciate that the present disclosure suggests semiconductor devices having structures with minimal length and/or width dimensions smaller than 100 nm, preferably smaller than 50 nm, more preferably smaller than 35 nm.

The person skilled in the art understands that MOS transistors may be fabricated as P-channel MOS transistors or PMOS transistors and as N-channel transistors or NMOS transistors, and both may be fabricated with or without mobility enhancing stressor features or strain-inducing features. A circuit designer can mix and match device types, using PMOS and NMOS transistors, stressed and unstressed, to take advantage of the best characteristics of each device type as they best suit the circuit being designed. The person skilled in the art understands that stress and strain may be generally described with regard to the tensile modulus.

In describing the following figures, semiconductor devices and methods of forming semiconductor devices in accordance with various exemplary embodiments of the present disclosure will be illustrated. The described process steps, procedures and materials are to be considered only as exemplary embodiments designed to illustrate to one of ordinary skill in the art, methods for practicing the invention. However, it is to be understood that the invention is not exclusively limited to the illustrated and described exemplary embodiments, as many possible modifications and changes exist which will become clear to the ordinary person skilled in the art when studying the present detailed description together with the accompanying drawings and the above background and summary of the invention. Illustrated portions of semiconductor devices may include only a single element, although those skilled in the art will recognize that actual implementations of semiconductor devices may include a large number of such elements. Various steps in the manufacture of semiconductor devices are well known and so, in the interest of brevity, many conventional steps will only be mentioned briefly herein, or will be omitted entirely without providing the well-known process details.

Recent measurements indicated that thin films of doped hafnium oxide can produce a spontaneous polarization at intermediate doping levels, potentially resulting in usable ferroelectric hysteresis loops in these layers. For example, Y:$HfO_2$ thin films with a $YO_{1.5}$ content of 5.2 mol % show a ferroelectric hysteresis with remanent polarization Pr of 24 $\mu C/cm^2$. A thin Si:$HfO_2$ film was shown to exhibit a ferroelectric hysteresis with remanent polarization Pr of 10 $\mu C/cm^2$ at an $SiO_2$ content of 3.4 mol %. Furthermore, in $ZrO_2$ doped hafnium oxide material, a remanent polarization Pr of 15 $\mu C/cm^2$ was observed at an admixture of 50 mol % $ZrO_2$.

Data obtained in the above presented examples suggests that the structural origin of spontaneous polarization in doped $HfO_2$ is linked to the stabilization of the orthorhombic phase in doped hafnium oxide. Although hafnium oxide-based thin films show a ferroelectric behavior and, by incorporating an appropriate dopant structure into hafnium oxide, it seems possible to achieve high density ferroelectric memories, an implementation in existing processes for integrating ferroelectrics in microelectronic devices shows severe drawbacks as described above with regard to the state in the art.

In view of the present situation, it is proposed to form an undoped amorphous $HfO_2$ layer over a substrate, for example, by means of an ALD process. Thereafter, a TiN layer is formed on the undoped amorphous $HfO_2$ layer. The inventors could show that an undoped $HfO_2$ layer of ferroelectric nature can be manufactured.

The person skilled in the art will appreciate that ferroelectric material layers of undoped hafnium oxide can be easily implemented in existing process flows such that, given the vast experience in integrating $HfO_2$ based thin films into advanced semiconductor devices, ferroelectricity can be easily provided by existing processes without affecting the reliability and scaling properties to be achieved for complex semiconductor devices. Particularly, the scaling of ferroelectric non-volatile memory devices can be positively affected.

With regard to FIGS. 1a-1c, some illustrative embodiments of the present disclosure will be described in greater detail. FIG. 1a schematically shows a semiconductor device 100 in accordance with an illustrative embodiment of the present disclosure at an early stage during fabrication. At this stage, a semiconductor substrate 102 is provided. The substrate 102 may comprise a semiconductor material which may be selected from silicon, germanium, silicon/germanium, silicon/germanium/carbon, silicon/carbon, gallium arsenide, indium arsenide, indium phosphate and other appropriate semiconductor materials. In some illustrative embodiments, the substrate 102 may comprise silicon. The person skilled in the art will appreciate that the substrate 102 may be a single crystalline silicon layer having a surface orientation, i.e., a crystallographic orientation of the surface normal of a top surface of the substrate 102 being one of a major crystallographic orientation. In some illustrative embodiments, the substrate 102 may be one of a bulk substrate, a semiconductor-on-insulator (SOI) substrate and a hybrid substrate. The substrate 102 may have a strain or stress built in for enhancing the mobility of majority charge carriers. Additionally, or alternatively, the substrate 102 may be doped, such as having one or more well regions. This does not pose any limitation to the present disclosure and, at the stage as shown in FIG. 1a, the substrate 102 may be undoped.

In some illustrative examples, an optional layer 106 may be formed on the semiconductor substrate 102. For example, the optional layer 106 may comprise one of TiN, $SiO_2$ and SiON. Alternatively, the optional material layer 106 may be omitted, as it is indicated by a broken line in FIG. 1a.

An amorphous undoped $HfO_2$ layer 122 is formed over the substrate 102. In some illustrative examples herein, the amorphous undoped $HfO_2$ layer 122 may be disposed on the substrate 102, i.e., the amorpous undoped $HfO_2$ layer may be in direct contact with the underlying substrate 102. In alternative embodiments, the amorphous undoped $HfO_2$ layer 122 may be disposed on the optional material layer 106.

In accordance with illustrative embodiments of the present disclosure, the amorphous undoped $HfO_2$ layer 122 may be formed by performing an ALD process 120 for depositing the amorphous undoped $HfO_2$ layer 122. In some special examples herein, a deposition temperature may be in a range from about 200-400° C., such as, for example, from about 200-300° C. In some advantageous implementations of the present disclosure, the deposition temperature is less than 300° C., or even less than 250° C.

A thickness of the deposited undoped amorphous $HfO_2$ layer 122 may be in a range between about 4-20 nm. In some advantageous implementations of the present disclosure, the $HfO_2$ layer 122 is formed with decreasing thickness, such as less than 10 nm, or even less than 6 nm. In an explicit example of the present disclosure, the undoped $HfO_2$ layer 122 may be 6 nm thick, without posing any limitation to the present disclosure.

Figure 1B:
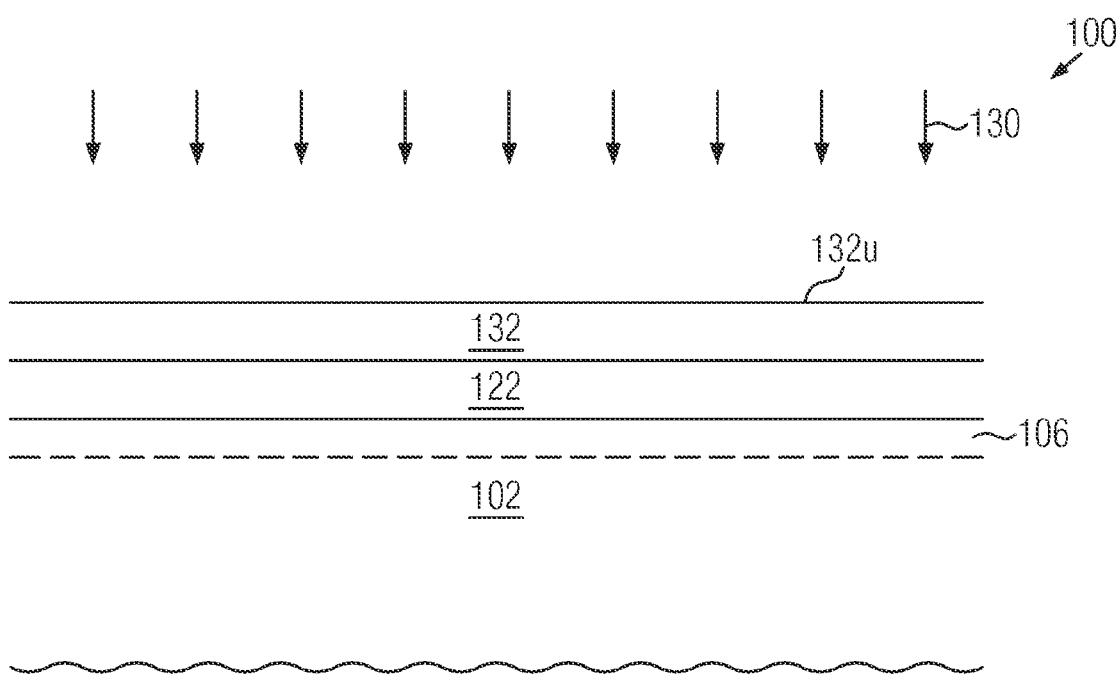

FIG. 1b depicts the semiconductor device 100 at a more advanced stage during fabrication in which a capping layer is formed on the undoped amorphous $HfO_2$ layer 122. In illustrative embodiments of the present disclosure, the capping layer may comprise a TiN layer 132 or even be given by the TiN layer 132. In an illustrative example, the undoped amorphous $HfO_2$ layer 122 may be fully covered by the TiN layer 132.

In some illustrative examples herein, the TiN layer 132 has an average oxygen content in a range from about 2-30%, for example, in a range from about 2-20%, and, for best results, in a range from about 2-15%. The average oxygen content may be, for example, determined by determining the oxygen content in a given volume of TiN material of the TiN layer 132, and the average oxygen content may be obtained by extrapolating the oxygen content of the given volume. Accordingly, an extrapolated value may be obtained which represents the averaged oxygen content across the TiN layer 132. The averaging may be improved by extrapolating the oxygen content of a plurality of preset measurement volumes and averaging the extrapolated values. The person skilled in the art will appreciate that this does not pose any limitation to the present disclosure and merely serves to illustrate a possibility to obtain an average value. In some advantageous implementations of the present disclosure, the $HfO_2$ layer 122 is formed with decreasing oxygen content, such as less than 10%, or even less than 5%.

In some illustrative examples, the TiN layer may have a bulk resistivity of greater than about 100 μΩcm and smaller than about 400 μΩcm, such as, for example, smaller than about 350 μΩcm, and, for best results, smaller than about 300 μΩcm.

In some illustrative examples, the TiN layer 132 may have a density in a range from about 4.5-5.2 $g/cm^3$, and, for best results, in a range from about 4.55-5.15 $g/cm^3$.

In some special illustrative examples, the TiN layer 132 may have a compressive internal stress in a range from about 200-1500 MPa. For example, the compressive internal stress of the TiN layer 132 may be at about 250 MPa or greater.

In some special illustrative embodiments of the present disclosure, an oxygen content distribution along a depth direction of the TiN layer 132, i.e., parallel to a normal direction of an upper surface 132$u$ of the TiN layer 132, may be formed. For example, the oxygen content profile may be such that an oxygen content at an upper surface 132$u$ of the TiN layer is in a range from about 5-15% and an oxygen content at an interface of the TiN layer 132 with the undoped amorphous $HfO_2$ layer 122 is smaller than 7%. In some illustrative examples herein, an oxygen content profile may be provided such that the oxygen content present at an upper surface 132$u$ of the TiN layer 132 is greater than about 5% and decreases to about 0% at an interface of the TiN layer 132 with the undoped amorphous $HfO_2$ layer 122. The person skilled in the art will appreciate that, accordingly, an oxygen gradient may be provided in the TiN layer 132, the oxygen gradient being oriented in parallel to a normal direction of the upper surface 132$u$. In an explicit example, the oxygen content at the upper surface 132$u$ may be in a range from 2-5% and the oxygen content at the interface may be below 5%.

In illustrative embodiments of the present disclosure, the TiN layer 132 may be formed in a deposition process 130. In some illustrative embodiments of the present disclosure, the deposition process 130 may comprise a physical vapor deposition (PVD) process. A deposition temperature of the deposition process 130 may be substantially smaller than or equal to about 400° C. and, for best results, smaller than or equal to about 300° C. In some special illustrative examples herein, the deposition temperature may be substantially about room temperature. For example, the TiN layer 132 may be deposited on the undoped amorphous $HfO_2$ layer 122 such that the undoped amorphous $HfO_2$ layer 122 remains amorphous throughout the deposition process 130.

In accordance with some illustrative examples herein, the PVD process may be performed with a specific ratio of titanium/nitrogen which is adjusted during the deposition process 130. For example, the PVD process may be a sputter process.

In a specific illustrative example, a nitrogen/oxygen atmosphere may be established in a process chamber so as to form an oxygen content at an upper surface 132$u$ of the TiN layer in a range from about 2-15% or 5-10%, and an oxygen content at an interface of the TiN layer 132 with the undoped amorphous $HfO_2$ layer 122 is smaller than 7%. For example, the nitrogen content may be changed during the deposition process 130 such that a desired oxygen content profile and a desired oxygen gradient may be established across the TiN layer 132. In an explicit example, the oxygen content at the upper surface 132$u$ may be in a range from about 2-5% and the oxygen content at the interface may be below 5%.

In another specific illustrative example, the deposition process 130 comprises a PVD process which is performed in a nitrogen atmosphere. The person skilled in the art will appreciate that a specific ratio of titanium/nitrogen may be adjusted during the deposition process 130. After the TiN layer 132 is formed, a thermal annealing process may be performed in an oxygen-comprising atmosphere for forming a desired oxygen content profile within the TiN layer 132. For example, an oxygen content profile as indicated above may be formed. In a special illustrative way, an oxygen gradient may be provided within the TiN layer 132. The oxygen gradient may be configured as described above.

FIG. 1$c$ depicts the semiconductor device 100 at a more advanced stage during fabrication in accordance with some illustrative embodiments of the present disclosure. A thermal annealing process 140 is performed for at least partially inducing a ferroelectric phase in the undoped amorphous $HfO_2$ layer 122. In some illustrative examples, the TiN layer 132 may fully encapsulate the undoped amorphous $HfO_2$ layer 122 so as to obtain a fully kept nucleation of $HfO_2$ layer crystallites during the thermal annealing process 140.

In some illustrative embodiments of the present disclosure, the thermal annealing process may be a rapid thermal anneal process exposing the semiconductor device 100 during the thermal annealing process 140 to temperatures of about 400-1100° C. and, for best results, to about 800° C. The person skilled in the art will appreciate that the annealing temperature may depend on a thickness of the undoped amorphous $HfO_2$ layer 122 and may be accordingly chosen.

Figure 2:
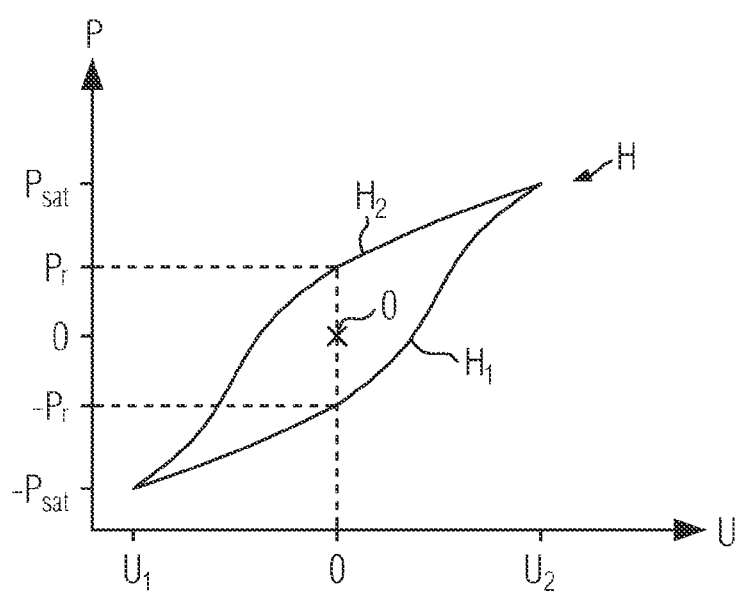
FIG. 2 schematically illustrates a graphical relation representing ferroelectric behavior of a hafnium oxide material layer in accordance with an illustrative embodiment of the present disclosure.

FIG. 2 depicts a hysteresis curve H of a ferroelectric undoped hafnium oxide material, such as the undoped $HfO_2$ layer 122, after the thermal annealing process 140 is performed.

The diagram depicted in FIG. 2 has an ordinate representing the polarization P (measured in $\mu C/cm^2$) plotted versus an abscissa representing an applied voltage U (arbitrary units, e.g., in the range of 1-5 V without limiting the present disclosure in this respect). An origin O of the diagram of FIG. 2 denotes zero polarization and zero voltage U, as indicated by broken lines in FIG. 2.

As visible from FIG. 2, ferroelectricity is characterized by the polarization of a material running through a hysteresis between two saturation polarizations $P_{sat}$ and $-P_{sat}$. For example, when increasing the voltage U from $U_1$ at which the polarization has a minimum polarization $-P_{sat}$ to a maximum voltage $U_2$, the polarization of the material changes along the curve portion H1 of the hysteresis curve H and becomes saturated (P assumes the saturation polarization $P_{sat}$). When reducing again the applied voltage U from $U_2$ at maximum polarization $P_{sat}$ to $U_1$, the polarization changes as indicated by the curve portion H2 of the hysteresis curve H until the polarization becomes saturated (negative saturation polarization $-P_{sat}$) at $U_1$. It is noted that further increasing/decreasing the voltage U beyond the voltage $U_2/U_1$ does indeed not change the polarization because all dipoles of the ferroelectric materials are aligned in an electric field imposed by the applied voltage and therefore saturation is to be expected.

In, starting from $U_2/U_1$, reducing/increasing the applied voltage U to zero, the polarization decreases/increases (along H2/H1) to a non-vanishing polarization value $P_r/-P_r$ at U=0, usually referred to as "remanent polarization." In dependence on a previously-induced saturation polarization caused by some previously applied voltage, a specific remanent polarization of a ferroelectric material is therefore maintained, even after disconnecting the ferroelectric material from an electrical power source. In this way, a ferroelectric material may be "programmed" into a remanent polarization state, which allows identifying a previously-applied voltage level, i.e., greater or smaller than zero.

The inventors observed a remanent polarization of about 2 $\mu C/cm^2$ in a ferroelectric undoped $HfO_2$ layer capped by a TiN layer as described above in accordance with some illustrative embodiments that were discussed above with regard to FIGS. 1a-1cd and 2. In other experiments involving an undoped $HfO_2$ layer having a thickness of 6 nm, a remanent polarization of about 10 $\mu C/cm^2$ were observed.

Figure 3A:
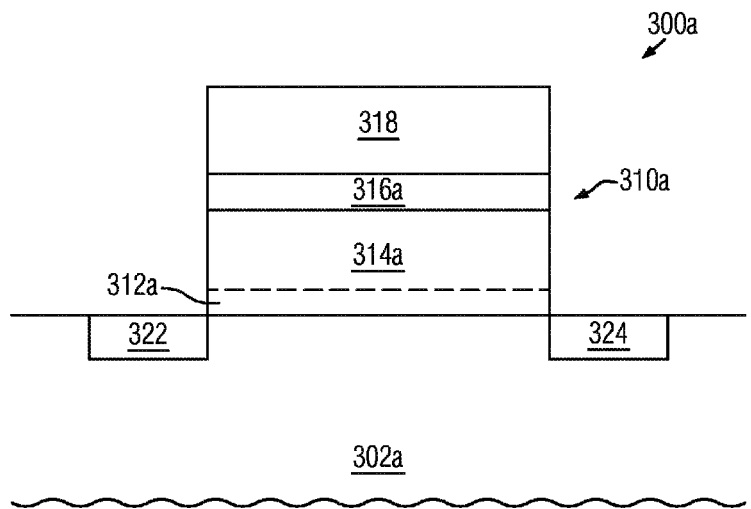
FIG. 3a schematically illustrates a FeFET device structure in accordance with an illustrative embodiment of the present disclosure.
Figure 3B:
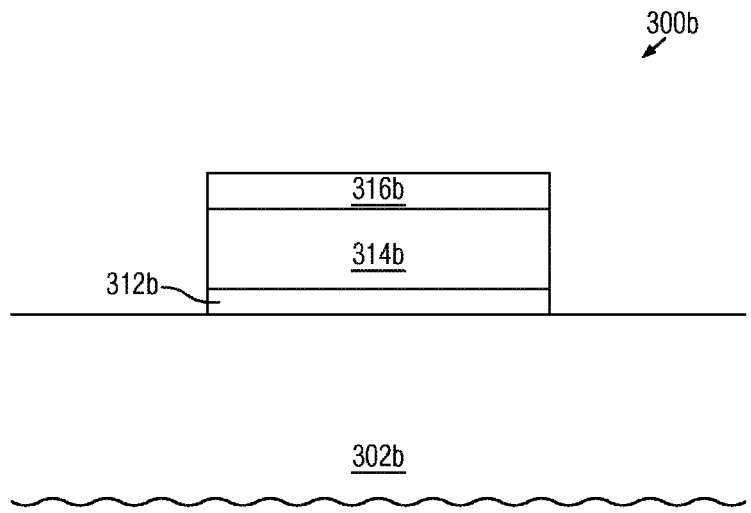
FIG. 3b schematically illustrates a capacitor structure in accordance with an illustrative embodiment of the present disclosure.

Some illustrative applications of the present disclosure will be further discussed with regard to FIGS. 3a and 3b. In FIG. 3a, a semiconductor device 300a is depicted. The semiconductor device 300a may be formed in and on a substrate 302a. The substrate 302a may be similar to the substrate 102 as described with regard to FIG. 1a above. As depicted in FIG. 3a, the semiconductor device 300a comprises a gate electrode structure 310a formed over a surface portion of the substrate 302a. In an explicit example, the gate electrode structure 310a may be formed directly on the substrate 302a. The gate electrode structure 310a may comprise an optional SiON layer 312a, an undoped ferroelectric $HfO_2$ layer 314a, a TiN layer 316a and a gate material layer 318, such as a polysilicon material layer. At opposing ends of the gate electrode structure 310a, a source region 322 and a drain region 324 are formed in the substrate 302a. The SiON layer 312a is optional, as indicated by the broken line. This does not pose any limitation to the present disclosure and the person skilled in the art will appreciate that an $SiO_2$ layer may be formed in place of the SiON layer 312a, or, alternatively, the ferroelectric undoped $HfO_2$ layer 314a may be disposed directly on the substrate 302a.

In some illustrative embodiments of the present disclosure, the semiconductor device 300a may be operated as a FeFET. Herein, the source region 322 and the drain region 324 may be coupled to source/drain contacts (not illustrated) and the gate electrode 318 may be coupled to a gate contact (not illustrated). It is understood that the source region 322 may be coupled to a source potential Vs, the drain region 324 may be coupled to a drain potential Vd and the gate structure 310a may be coupled to a gate potential Vg. The person skilled in the art will appreciate that a quiescent state may be given by Vg=0V, Vd=0V, Vs=0V.

In the following discussion of illustrative operation modes for the semiconductor device 300a, an N-channel FeFET configuration of the semiconductor device 300a is assumed. Herein, for example, the substrate 302a may be at least locally adjacent to the semiconductor device 300a provided as a P-type well and the source region 322 and the drain region 324 are provided by N-type doped regions embedded into the substrate 302a. The person skilled in the art will appreciate that, in some illustrative examples, the drain potential Vd may be supplied by first bitlines (not illustrated), the source potential Vs may be supplied by second bitlines (not illustrated) and the gate potential Vg may be supplied by wordlines (not illustrated).

In an N-channel FeFET, programming of the semiconductor device 300a by turning the ferroelectric undoped $HfO_2$ layer 314a into a first polarization state may be achieved by providing a voltage pulse to the gate electrode structure 310a, wherein the voltage pulse has an amplitude Vp. In some illustrative examples herein, the first polarization state may be associated with the information state "0". Accordingly, when setting the amplitude of the voltage pulse to -Vp, a second polarization state can be defined in the undoped ferroelectric $HfO_2$ layer 314a. The second polarization state may be, for example, identified with the information state "1". This does not pose any limitation to the present disclosure and, alternatively, the assignment of an information state to a polarization state may be reversed.

With regard to the discussion of FIG. 2 above, the amplitude Vp may be substantially equal to $U_2$ as discussed with regard to FIG. 2 above. On the other hand, the amplitude -Vp is substantially equal to $U_1$ as discussed with FIG. 2 above. However, this does not pose any limitation to the present disclosure, and the person skilled in the art will appreciate that an amplitude Vp or -Vp that does not completely induce a saturated polarization state of the undoped ferroelectric $HfO_2$ layer 314a may be chosen instead. It is to be understood that, during programming, the potentials Vd and Vs are set to 0V for obtaining best results.

After switching off the programming potential supplied to the gate electrode structure 310a, a remanent polarization (see $P_r$ or $-P_r$ in FIG. 2) will remain in the undoped ferroelectric $HfO_2$ layer 314a. Therefore, the remanent polarization corresponding to the first polarization state induced by Vp can be associated with the information state "0" and the remanent polarization corresponding to -Vp can be associated with the information state "1" of the semiconductor device 300a.

A non-vanishing remanent polarization of the undoped ferroelectric $HfO_2$ layer 314a results in a shift in the threshold voltage of the semiconductor device 300a. As the different remanent polarization states of the ferroelectric undoped $HfO_2$ layer 314a are associated with different information states "0", "1", these different remanent polarization states result after programming in different threshold voltages of the semiconductor device 300a. Upon determining a current flow between the source region 322 and the drain region 324 when applying a predetermined gate potential to the gate electrode structure 310a, the different threshold voltages and, accordingly, the different information states "0", "1" can be determined.

In a special illustrative example herein, reading out from the semiconductor device 300a may be performed by applying a gate potential Vg=Vr to the gate electrode structure 310a and a drain potential Vd=Vdr to the drain 322. In explicit examples herein, the source 324 may be coupled to a source potential Vs=0V. It is to be understood that when reading out of information from the semiconductor device 300a is performed, the information state "0" resulting from a programming by a programming potential "+Vp" results in a greater source/drain current than the information state "1" resulting from the programming with the programming potential "-Vp". Therefore, the information state "0", "1" may be distinguished by the amount of current flowing between the source region 322 and the drain region 324 at a preset reading potential Vr applied to the gate electrode structure 310a and a reading potential Vdr applied to the drain 322. Moreover, the read-out procedure as described above can be non-destructive, i.e., the information state imposed on the gate electrode structure 310a by a specific polarization state induced in the ferroelectric undoped $HfO_2$ layer 314a may be preserved, particularly when selecting a reading potential with an absolute value smaller than the absolute value of the applied programming potential.

The person skilled in the art will appreciate that a method for forming a semiconductor device as provided by the present disclosure is very easily included into existing fabrication process flows of complex semiconductor devices. It is possible to manufacture a high number of semiconductor devices in parallel, wherein ferroelectric characteristics in $HfO_2$ layers of semiconductor devices may be selectively adjusted or "activated" without the need for dopants and, therefore, without the need to introduce additional doping sequences into existing process flows.

Figure 1C:
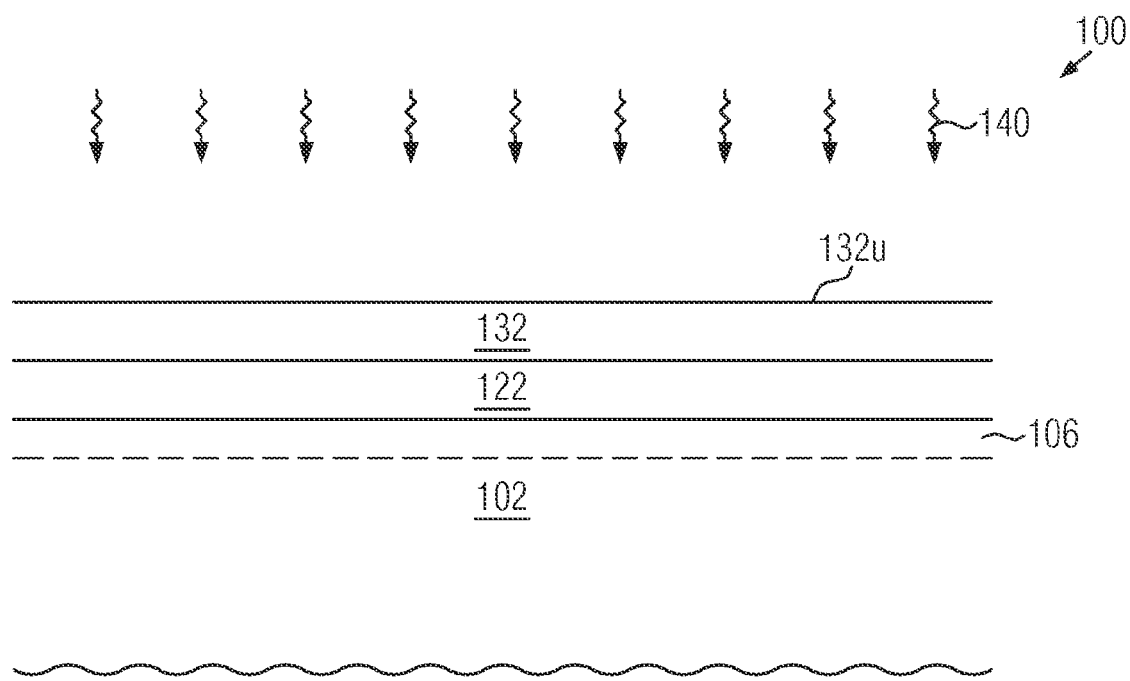

In some illustrative embodiments of the present disclosure, this may be achieved by selectively forming a TiN layer, such as the TiN layer 132 as discussed with regard to FIGS. 1a-1c or the TiN layer 316a as described above with regard to FIG. 3a, only on selected semiconductor devices by, for example, masking portions over the substrate 302a in which semiconductor devices are to be fabricated which should not have any ferroelectric characteristic.

In some explicit examples herein, a first and a second semiconductor device may be provided in a first and a second active region of a substrate, such as, for example, a substrate as described above with regard to FIGS. 1a and 3a. The first and second active regions may be separated by an insulating structure, such as an STI structure and/or one or more further active regions formed in between.

An undoped amorphous $HfO_2$ layer may be formed over the first and second active regions such that a first undoped amorphous $HfO_2$ layer can be formed over the first active region and a second undoped amorphous $HfO_2$ layer can be formed over the second active region. Accordingly, the first semiconductor device may comprise, at this stage of fabrication, a first undoped amorphous $HfO_2$ layer and the second semiconductor device may comprise, at this stage of fabrication, a second undoped amorphous $HfO_2$ layer. The person skilled in the art will appreciate that other active regions which may be possibly present in the substrate may be covered by an appropriate masking structure such that the first and second active regions are exposed to a deposition process for forming the first and second undoped amorphous $HfO_2$ layers. In some illustrative examples herein, the deposition process may be an ALD process.

Next, a masking structure may be formed over the substrate, the masking structure overlying the first active region and leaving the second active region exposed to further processing. In some illustrative examples herein, a mask or hardmask structure may be formed on the first active region.

Subsequently, a TiN layer may be formed on the second undoped amorphous $HfO_2$ layer in accordance with formation processes as described with regard to the TiN layer 132 or the TiN layer 316a above.

After having formed the TiN layer over the second undoped amorphous $HfO_2$ layer over the second active region, the masking structure of the first active region may be removed and a second masking structure covering the second active region may be formed such that the first active region is exposed to further processing.

A second TiN layer may be formed over the first undoped $HfO_2$ layer in accordance with conventional techniques, such as known CVD processes. The person skilled in the art will appreciate that upon exposing the second active region to temperatures of 400° C. and more, the ferroelectric properties of the second $HfO_2$ layer may be activated, while the first $HfO_2$ layer will not be ferroelectric and show paraelectric properties as known in the art.

Therefore, ferroelectric semiconductor devices and non-ferroelectric semiconductor devices may be easily fabricated in a manner consistent with existing fabrication process flows, i.e., without the need of introducing additional doping processes.

With regard to FIG. 3b, a further semiconductor device structure 300b will be described. The semiconductor device structure 300b comprises a substrate 302b similar to the substrate 102 as described above with regard to FIGS. 1a-1c or the substrate 302a as described above with regard to FIG. 3a. Furthermore, a bottom electrode layer 312b is formed over the semiconductor substrate 302b. Although FIG. 3b depicts the bottom electrode 312b as being directly formed on an upper surface of the substrate 302b, this does not pose any limitation to the present disclosure, and the person skilled in the art will appreciate that one or more additional layers may be formed in between the bottom electrode 312b and the substrate 302b. For example, an insulating layer (not illustrated) may be formed in between the bottom electrode 312b and the substrate 302b. Alternatively, an electrically-conducting structure may be formed in between the bottom electrode 312b and the substrate 302b. In this case, the person skilled in the art will appreciate that the substrate 302b may have a doped well region formed therein, at least locally in a region adjacent to the semiconductor device structure 300b. For example, the bottom electrode 312b may be coupled by a conducting structure (not illustrated) to a doped region (not illustrated) formed in the substrate 302b.

An undoped ferroelectric $HfO_2$ layer 314b is formed on the bottom electrode 312b. The undoped ferroelectric $HfO_2$ layer 314b may be formed in accordance with a process as described above with regard to FIGS. 1a-1c or with regard to FIG. 3a.

Furthermore, the semiconductor device structure 300b comprises a TiN layer 316b formed on the undoped ferroelectric $HfO_2$ layer 314b. The TiN layer 316b is similar to the TiN layer 132 as discussed with regard to FIGS. 1a-1c above or to the TiN layer 316a as discussed with regard to FIG. 3a above.

In a special illustrative embodiment of the present disclosure, the semiconductor device structure 300b may form a MIM or MIS capacitor structure. An according semiconductor device structure 300b may be coupled to a FET device (not illustrated) such that the bottom electrode 312b may be coupled to one of the source and drain of the FET device (not illustrated). An according combination of a FET device (not illustrated) and the semiconductor device structure 300b may implement a 1T-1C FeRAM memory cell structure including a conventional, i.e., non-ferroelectric, FET acting as an access transistor, while the semiconductor device structure includes an undoped ferroelectric $HfO_2$ layer 314b. The person skilled in the art will appreciate that opposed to a D-RAM memory cell, only one capacitor and one access transistor is used to form the memory cell. Furthermore, the person skilled in the art will appreciate that an according FeRAM structure may be easily formed in accordance with existing fabrication flows without introducing unnecessary doping processes. Therefore, non-volatile memory devices based on ferroelectric FeRAM devices may be provided with a high degree of uniformity across a semiconductor wafer by using existing fabrication process flows without the need of including complex doping processes. A capacitor may be read out in accordance with the discussion of reading and writing operations as described above.

The present disclosure proposes to use a specifically-engineered TiN layer for enabling ferroelectricity in pure $HfO_2$ material. Therefore, it is possible to have undoped $HfO_2$ formed with ALD processes and to induce a stable ferroelectric crystalline phase in pure $HfO_2$. For example, the inventors observed a stabilization effect occurring in ALD deposited pure $HfO_2$ due to PVD-TiN encapsulation, wherein the TiN layer shows a specific oxygen content profile, such as an oxygen gradient. The ferroelectric pure $HfO_2$ material provided by the present disclosure shows a higher conformality as compared to $HfO_2$ deposited by physical vapor deposition processes or doped $HfO_2$ material formed by ALD processes. Particularly, performing doping in ALD processes makes existing fabrication of semiconductor devices very complex because it is necessary to control a uniform dopant concentration across the wafer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
    a substrate;
    an undoped $HfO_2$ layer formed over said substrate, wherein said undoped $HfO_2$ layer is at least partially ferroelectric; and
    a TiN layer formed on said undoped $HfO_2$ layer, wherein said TiN layer has an oxygen content profile formed therein, said oxygen content profile showing an oxygen content at an upper surface of said TiN layer in a range from about 5-15% and an oxygen content at an interface of said TiN layer with said undoped $HfO_2$ layer in a range from about 0-7%.

2. The semiconductor device of claim 1, wherein said oxygen content profile represents an oxygen gradient.

3. The semiconductor device of claim 1, wherein said undoped $HfO_2$ layer has a thickness in a range from about 1-30 nm.

4. The semiconductor device of claim 1, wherein said undoped $HfO_2$ layer has a thickness in a range from about 2-20 nm.

5. The semiconductor device of claim 1, wherein said TiN layer has a bulk resistivity in a range from about 100-400 $\mu\Omega cm$.

6. The semiconductor device of claim 1, wherein said TiN layer has a bulk resistivity in a range from about 100-300 $\mu\Omega cm$.

7. The semiconductor device of claim 1, wherein said TiN layer has a density in a range from about 4.5-5.2 $g/cm^3$.

8. The semiconductor device of claim 1, further comprising a gate material layer formed above said undoped HfO2 layer and said TiN layer.

9. The semiconductor device of claim 8, wherein said undoped $HfO_2$ layer is formed on an SiON layer.

10. The semiconductor device of claim 1, further comprising a bottom electrode layer formed below said undoped $HfO_2$ layer and said TiN layer.

11. A method for forming a semiconductor device, comprising:
    forming an undoped amorphous $HfO_2$ layer over a semiconductor substrate;
    forming a TiN layer on said undoped amorphous $HfO_2$ layer, wherein said TiN layer has an oxygen content profile formed therein, said oxygen content profile showing an oxygen content at an upper surface of said TiN layer in a range from about 5-15% and an oxygen content at an interface of said TiN layer with said undoped $HfO_2$ layer in a range from about 0-7%; and
    performing a thermal annealing process for at least partially inducing a ferroelectric phase in said undoped amorphous $HfO_2$ layer.

12. The method of claim 11, wherein said TiN layer is deposited by performing a PVD process in an atmosphere comprising one of nitrogen and oxygen/nitrogen.

13. The method of claim 12, wherein said PVD process is performed at temperatures smaller or equal than about 400° C.

14. The method of claim 13, further comprising adjusting a specific ratio of titanium/nitrogen when performing said PVD process.

15. The method of claim 11, wherein said TiN layer is amorphous.

16. The method of claim 11, wherein said undoped amorphous $HfO_2$ layer is formed by performing an ALD process to deposit a layer of undoped amorphous $HfO_2$ with a thickness in a range from 4-20 nm.

17. The method of claim 16, wherein a deposition temperature during said ALD process is out of a range from about 200-400° C.

18. The method of claim 11, wherein said thermal annealing process is performed at an annealing temperature of at least about 400° C. and at most about 1100° C.

* * * * *